(12) United States Patent
Basawapatna et al.

(10) Patent No.: US 9,134,355 B2
(45) Date of Patent: Sep. 15, 2015

(54) APPARATUS FOR VERY HIGH SPEED ADAPTIVE SPECTRUM ANALYSIS

(71) Applicants: Ganesh Ramaswamy Basawapatna, Greenwood Village, CO (US); Varalakshmi Basawapatna, Greenwood Village, CO (US); Anand Ganesh Basawapatna, Greenwood Village, CO (US); Ashok Ram Basawapatna, Greenwood Village, CO (US)

(72) Inventors: Ganesh Ramaswamy Basawapatna, Greenwood Village, CO (US); Varalakshmi Basawapatna, Greenwood Village, CO (US); Anand Ganesh Basawapatna, Greenwood Village, CO (US); Ashok Ram Basawapatna, Greenwood Village, CO (US)

( * ) Notice: Subject to any disclaimer, the term of this patent is extended or adjusted under 35 U.S.C. 154(b) by 105 days.

(21) Appl. No.: 13/775,522

(22) Filed: Feb. 25, 2013

(65) Prior Publication Data
US 2014/0240605 A1     Aug. 28, 2014

(51) Int. Cl.
*G01R 23/165* (2006.01)
*G01R 23/14* (2006.01)

(52) U.S. Cl.
CPC .............. *G01R 23/165* (2013.01); *G01R 23/14* (2013.01)

(58) Field of Classification Search
CPC ........ G01R 23/167; G01R 23/00; G01S 7/38; H04L 27/12; H04B 17/13; H04B 17/00
USPC ............. 324/6.19, 76.21; 702/76; 708/3, 316; 375/229, 295; 380/15, 20
See application file for complete search history.

(56) References Cited

U.S. PATENT DOCUMENTS

| | | | | |
|---|---|---|---|---|
| 2,998,538 A * | 8/1961 | O'Mahony | ....................... | 310/95 |
| 3,202,931 A * | 8/1965 | Koontz, Jr. | ....................... | 331/39 |
| 3,800,235 A * | 3/1974 | Carre et al. | ..................... | 327/41 |
| 4,451,782 A * | 5/1984 | Ashida | ........................ | 324/76.26 |
| 5,198,748 A * | 3/1993 | Tsui et al. | .................. | 324/76.35 |
| 5,818,215 A * | 10/1998 | Miyamae et al. | .......... | 324/76.27 |
| 6,275,020 B1 * | 8/2001 | Nagano | ........................ | 324/76.27 |
| 2008/0231254 A1 * | 9/2008 | Kanoh et al. | ................ | 324/76.19 |
| 2014/0111804 A1 * | 4/2014 | Maestle | ......................... | 356/364 |

* cited by examiner

*Primary Examiner* — Charlie Y Peng

(57) ABSTRACT

This invention describes a method by which Broadband Spectrum Analysis can be performed in the RF and Microwave frequency range with significantly higher speed, accuracy, and flexibility than existing RF and Microwave Spectrum Analyzers. This is done by eliminating the need for the filtering of the incoming signal, a process called preselection that needs to track in frequency with the scanning local oscillator in the instrument. By eliminating this requirement, this invention makes possible the identification and analysis of very broadband signals in a single sweep using an Adaptive Sweep Methodology and a Simultaneous Sweep capability that the present invention makes possible.

23 Claims, 8 Drawing Sheets

Apparatus for Very High Speed Adaptive Spectrum Analysis, Basawapatna, Attorney Docket No: BasawapatnaJan18-13

Effect of a signal at frequency 5000 MHz, with Flo increasing in steps from 4960 to 5070 MHz with $\Delta f = 10$ MHz
Input Noise is output when either $2\Delta f$ LPF output is zero
Multiplier output produces signal proportional to input from Flo = 4990 MHz to Flo 5010 MHz
All frequencies in table are in MHz

| Flo | LO 1 at Flo + $\Delta f$ | IF @ Mixer1 | $2\Delta f$ LPF Output Frequency @ Mixer 1 | LO 2 at Flo - $\Delta f$ | IF @ Mixer2 | $2\Delta f$ LPF Output Frequency @ Mixer 2 | Multiplier Output |
|---|---|---|---|---|---|---|---|
| 4950 | 4960 | 40 | - | 4940 | 60 | - | Input Noise |
| 4960 | 4970 | 30 | - | 4950 | 50 | - | Input Noise |
| 4970 | 4980 | 20 | 20 | 4960 | 40 | - | Input Noise |
| 4980 | 4990 | 10 | 10 | 4970 | 30 | - | Input Noise |
| 4990 | 5000 | DC | DC | 4980 | 20 | 20 | Input Signal |
| 5000 | 5010 | 10 | 10 | 4990 | 10 | 10 | Input Signal |
| 5010 | 5020 | 20 | 20 | 5000 | DC | DC | Input Signal |
| 5020 | 5030 | 30 | - | 5010 | 10 | 10 | Input Noise |
| 5030 | 5040 | 40 | - | 5020 | 20 | 20 | Input Noise |
| 5040 | 5050 | 50 | - | 5030 | 30 | - | Input Noise |
| 5050 | 5060 | 60 | - | 5040 | 40 | - | Input Noise |
| 5060 | 5070 | 70 | - | 5050 | 50 | - | Input Noise |

Figure 4

APPARATUS FOR VERY HIGH SPEED ADAPTIVE SPECTRUM ANALYSIS

FIELD OF THE INVENTION

This invention pertains to a method to create the ability to analyze RF and microwave signals via a new form of spectrum analyzer.

DEFINITION OF TERMS

Local Oscillator (LO): When a signal frequency is desired to be translated to another frequency a Local Oscillator is used in conjunction with a mixer to create the Intermediate Frequency (IF).

Mixer: When two frequencies, F1 and F2 are input to two ports of a mixer, it typically generates $\pm m \cdot F1 \pm n \cdot F2$, frequencies, where m and n are integers.

Intermediate Frequency (IF): All the resultants of the mixing process in the above paragraph are called Ifs. In particular, frequencies generated with m=n=1 are most often used in Fundamental Mixing.

IF Bandwidth: The bandwidth of the filter, which is typically a band-pass filter that follows the mixer and selects only the desired IF.

Video Detector: A device that creates a DC voltage proportional to the amplitude of the RF or IF signal applied to it.

Log Amp: Logarithmic Amplifier. Usually follows a detector and creates an output which is logarithmically proportional to the output so that the output can be displayed in decibels (dB).

YIG: Yttrium Iron Garnet. It has the property that it exhibits ferromagnetic resonance that is directly proportionate to the applied DC magnetic field, and this resonance can be coupled to by external circuits to build oscillators and bandpass or band-reject filters.

Sweep: Also called frequency sweep. It is the tuning of an oscillator or in some cases a filter from some start frequency to some stop frequency. It is possible to sweep in an Analog fashion where the frequency changes continuously with time, or in digital fashion, where the frequency steps discretely with time.

Reference Oscillator: An oscillator usually based upon an ideal resonator such as a Crystal Resonator with the property that its output waveform is very stable and has very low frequency drift and very low phase noise sidebands.

Resolution Bandwidth: This is the effective bandwidth within which the signal power is measured. It is used to measure the average power of a signal within a particular bandwidth. The narrower the resolution bandwidth, the more accurately are the sidebands of a carrier measured. However, narrower resolution bandwidths traditionally also mean longer measurement times, often with multiple sweeps.

BACKGROUND OF THE INVENTION

RF and Microwave Spectrum Analyzers are and have long been an important instrument family, used in a variety of applications including Laboratory analysis of signals and modulation spectra, Telecommunications signals, Satellite Communications, Electronic Warfare and other Defense applications. Recently, due to the increased use in WiFi applications such as 3G, 4G, and LTE architectures, it has become very important to have handheld spectrum analyzers that are light weight, have long battery life, and still have a high degree of accuracy. In addition the ability to quickly identify and analyze received signals has become very critical in many defense applications.

Most spectrum analyzers are built using a heterodyne type design. This is shown in block diagram form in FIG. 1. The incoming signal 101, whose frequency and other spectral characteristics are unknown, is mixed or frequency converted in a series of mixers 104 and 107 in this figure (or more or fewer mixers as desired by the designer of the analyzer) with a series of local oscillators 103 and 106, the first of which, 103 in FIG. 1, typically, is a swept signal source that is capable of being frequency synthesized to a desired level of frequency accuracy and stability. The mixer 104 output of this First Local Oscillator also called First LO, is filtered through a fixed bandwidth bandpass filter 105 to produce a First Intermediate Frequency, or First IF. Assuming that the purity of the First LO is much better than that of the incoming signal, any input to the signal analyzer will produce a signal with the same spectral characteristics as the input signal at the First IF at frequencies given by $$Fif = \text{Absolute value of}(\pm m \cdot Flo \pm n \cdot Fsig)$$

Where Fsig is the frequency being scanned for the existence of a signal, and m and n are integers. Typically all IF frequencies other than the desired one are eliminated by means of the First IF filter 105. In many analyzers m=1, but m can be 1,2, or a higher number depending upon the harmonic of the LO that the signal will mix with to produce Fif. Both m·Flo+Fsig and m·Flo−Fsig will create identical outputs at the input to the First IF. However, only one will be equal to Fif, and this signal will pass to the second W. After the First IF, a series of mixers, in this Figure, 107 is utilized in order to more accurately filter the First IF and to make it possible to detect, measure 109 and display 110 the resultant translated form of the input signal with the maximum amount of fidelity to the actual input signal as possible. This set of filter bandwidths is often called the Resolution Bandwidth of the analyzer, and it can be varied from front panel or remote controls. Unfortunately, the creation and existence of multiple harmonics of the signal and LO frequency within the mixer implies that there is the mathematical possibility that for some other values of n and m, n·Fsig mixing with m·Flo creates a signal at Fif. In this case, this signal will pass through as if it were a legitimate signal. This is called an image response. This is not acceptable as it can produce a spurious signal display at a frequency where there is no actual signal present at the input. In order to eliminate this, the input signal is passed through a tunable filter 102 that tracks the first LO frequency with an offset equal to the First IF frequency such that only the desired signal can cause the desired IF. This is called a Preselector, and in broadband analyzers the function is often realized by a tunable bandpass filter called a YIG tuned Filter (YTF). The LO is often a Yig Tuned Oscillator (YTO). If the YTF is integrated with the mixer, as is often done, such a component is called a Yig Tune Mixer or YTX.

There are many advantages to this traditional approach, the most important of which is that, until this present invention there always was needed a preselector, and there was no easy way other than a YIG device to achieve a broadband tunable Preselector Filter that tracked in frequency with a Local Oscillator. YIGs depend upon the resonance of Yttrium Iron Garnet spheres in the presence of a magnetic field. This resonance is almost linear with the applied magnetic field, so that if the magnetic field is realized by means of an electromagnet, the resonator can be frequency tuned over a wide frequency range in a linear relation to its drive voltage or current. A typical YIG structure is shown in FIG. 2, where the coil 201 tunes the sphere 202 via the electromagnet 206, creating a tuned resonance in coupling RF loops 203 and 204 (in this example a filter) that is the basis of the tuning of the filter in the YTF. When an oscillator is needed, only one coupling loop, for example 203 is used as a resonator for the local oscillator, YTO. In a YTF, at the resonance frequency if the loops are orthogonal, the RF energy is coupled into the sphere and transferred to the output loop. At all other frequencies there is no energy transfer except for leakage. The advantage of YIG resonance is that it has a high Quality Factor, called Q, which is a measure of purity of resonance, which allows for very good signal selectivity. The disadvantages unfortunately are many. The electromagnets have significant hysteresis which needs to be corrected. Their linearity is not perfect. They suffer from significant thermal drift. They require very high voltages to allow the magnets to overcome the tuning coil IR (current, 1 times Resistance R) voltage drops, and the L·(di/dt) drop, where L is the coil inductance and di/dt is the rate of change of current with time. This severely limits the speed with which the YIG devices can be tuned to different frequencies. In a spectrum analyzer, where the LO and preselector filter need to exactly track each other within the first IF bandwidth, these drifts impose significant other constraints. Another very difficult constraint is that while the YTO can indeed be phase locked or synthesized to any accuracy its crystal reference, 113, in FIG. 1, provides, the YTF, being essentially open loop, cannot have such accuracy. As a result, in YIG tuned spectrum analyzers, except for the start of a sweep, the first LO is never phase locked or accurate as a locked oscillator. The sweeps are essentially analog sweeps and the measurements at any frequency are subject to this analog inaccuracy. As a result, often, to narrow down on a signal the instruments need to follow a sequence of Peak Search, selecting the maximum value of the signal display—Centering the Frequency Band around the Peak—then reducing the span has to be done many times. Thus for each reduction of resolution bandwidth a minimum of 3 sweep are needed. To narrow down a signal from a 10 GHz span to a 100 KHz span, often 30 or more sweeps, each taking up 50 to 400 milliseconds are needed so that any measurement that requires this accuracy may need 5 to 10 seconds.

Other methods have been proposed and tried to solve these problems. It is possible for example, and has been proposed, to build the preselector out of a bank of switched bandpass filters. The problem with this solution is that if one wanted to build a broadband analyzer covering many decades of frequency range, many microwave filters would be required, along with banks of microwave switches. This is a very expensive and almost impractical solution. As a result this is not a method that is used except in specific narrow bandwidth instruments for very specialized applications. Another method that is used in many fixed or narrow frequency range receivers is called the Zero-IF receiver. Here, the mixer output is filtered with a very low frequency low pass filter, and when the LO frequency is equal to the input frequency there is a DC output voltage. There are no extra stages of IF. The problem with this method is that the IF is really a DC or close to DC value, which requires to sweep the signal very slowly, and is not usable even in moderate bandwidth receivers. Zero IF receivers are used, and are very effective in fixed frequency receivers, for example in testing known communication channels. They are very impractical in broadband receivers.

Another problem with these traditional approaches is that, to identify the existence of signals in the frequency range of interest and then to analyze the modulation, phase noise, or other characteristics of the spectra, multiple sweeps are needed. Since, due to YIG tuning speed limitations, each sweep is typically several hundred milliseconds in duration, any measurement that takes multiple sweeps will take many seconds to complete. In an agile signal environment for example in Electronic Warfare this is not be acceptable.

The present invention addresses these issues. It uses a completely different architecture to eliminate the need for preselection, so that accurate signal analysis can occur in microseconds, 100 to 1000 times faster than existing methods.

SUMMARY OF THE INVENTION

This invention recognizes that preselection is a filter-tuning process, and such a process over multi octave bandwidths slows down the speed of measurement, and is dependent on the preselector filter characteristics. A new, faster moving image spurious elimination paradigm is needed. This invention eliminates the need for preselection in spectrum analyzers.

This invention accomplishes the objective by a non-intuitive process that results in creating an IF frequency output if only if the input is at the correct frequency.

This is done, as will be explained in the sections below, by stagger tuning the input with a narrow frequency differential in two sections that results in an output only when a real signal exists at the scanned frequency and the output can only be created by a non-image frequency. We demonstrate that physically realizable higher order harmonics of the expected signal frequency cannot produce a desired IF frequency in both paths.

The system requires two digital or digital/analog tuned Local Oscillators that are programmable a fixed frequency apart. Both local oscillators are synthesized, and are capable of continuous multi-octave frequency tuning.

At the same time, this method allows the spectrum analyzer designed by this new method to change the sweep characteristics for quicker verification of signal dynamically in mid sweep. This process which we call Adaptive Sweep is a new functionality created by this invention. In addition, this method allows a user to simultaneously analyze the incoming signal with multiple resolution bandwidths. This process, called Simultaneous Processing, is also a new functionality that the present invention makes possible. As we will show this allows for very quick identification of signals, and to allow a method to narrow down on signals quickly, by reducing the resolution bandwidth in a narrow range and slowing down the sweep selectively, during the sweep, rather than waiting for a next sweep as the old method would require the system to do.

This is demonstrated in the detailed description of the invention that follows. Our invention provides almost all the advantages of the traditional preselected spectrum analyzer with faster speed, lower cost, and smaller size so truly exceptional performance handheld solutions can be created for signal analysis.

BRIEF DESCRIPTION OF THE DRAWINGS

The exemplary embodiments are best described by referring to the drawings attached. It should be emphasized that these drawings are for the purpose of explanation only. Many of the components shown in these exemplary drawings can be replaced by other components or combination of components achieving the same purpose.

FIG. 4 shows the effect of sweeping through a signal range in a table form to make the concept clearer.

DETAILED DESCRIPTION OF THE PROBLEM TO BE SOLVED, AND PREFERRED EMBODIMENTS

The invention concepts are described in this section using the drawings referred to. They do not represent all possible embodiments, but are used primarily for illustrative purposes.

Figure 1:
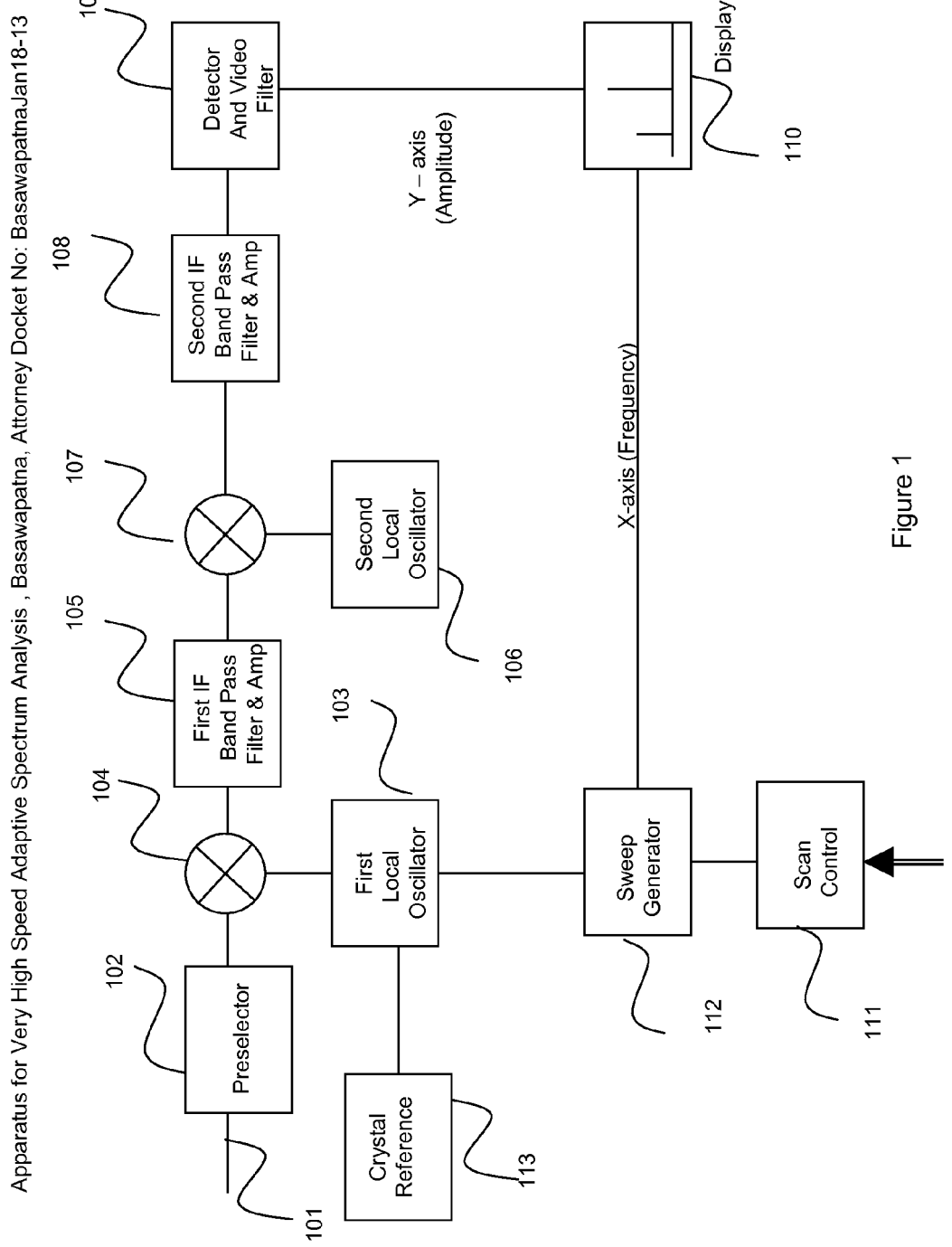
FIG. 1. shows a traditional Spectrum Analyzer realization in block diagram form.
Figure 2:
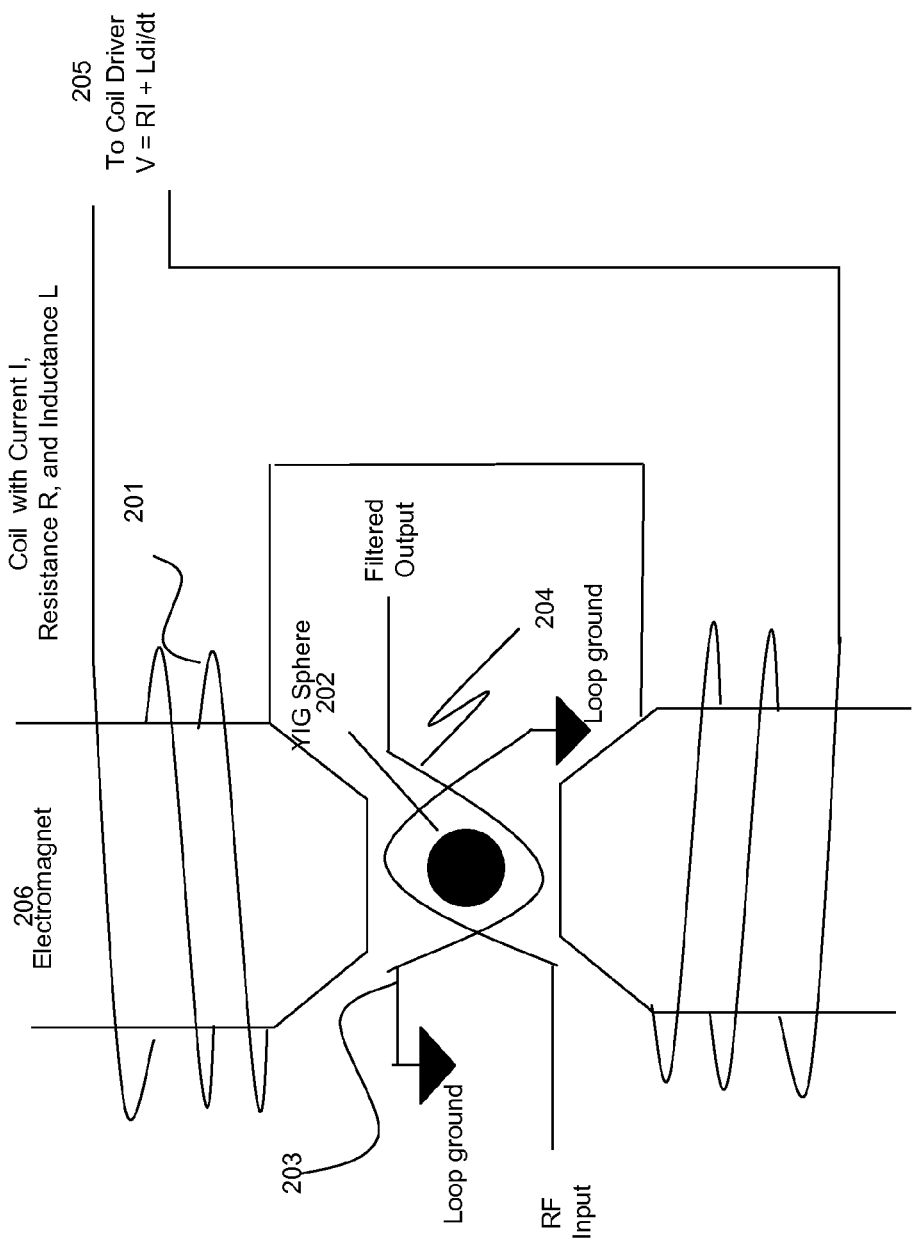
FIG. 2 shows a typical YIG preselected Spectrum Analyzer in block diagram form.
Figure 3:
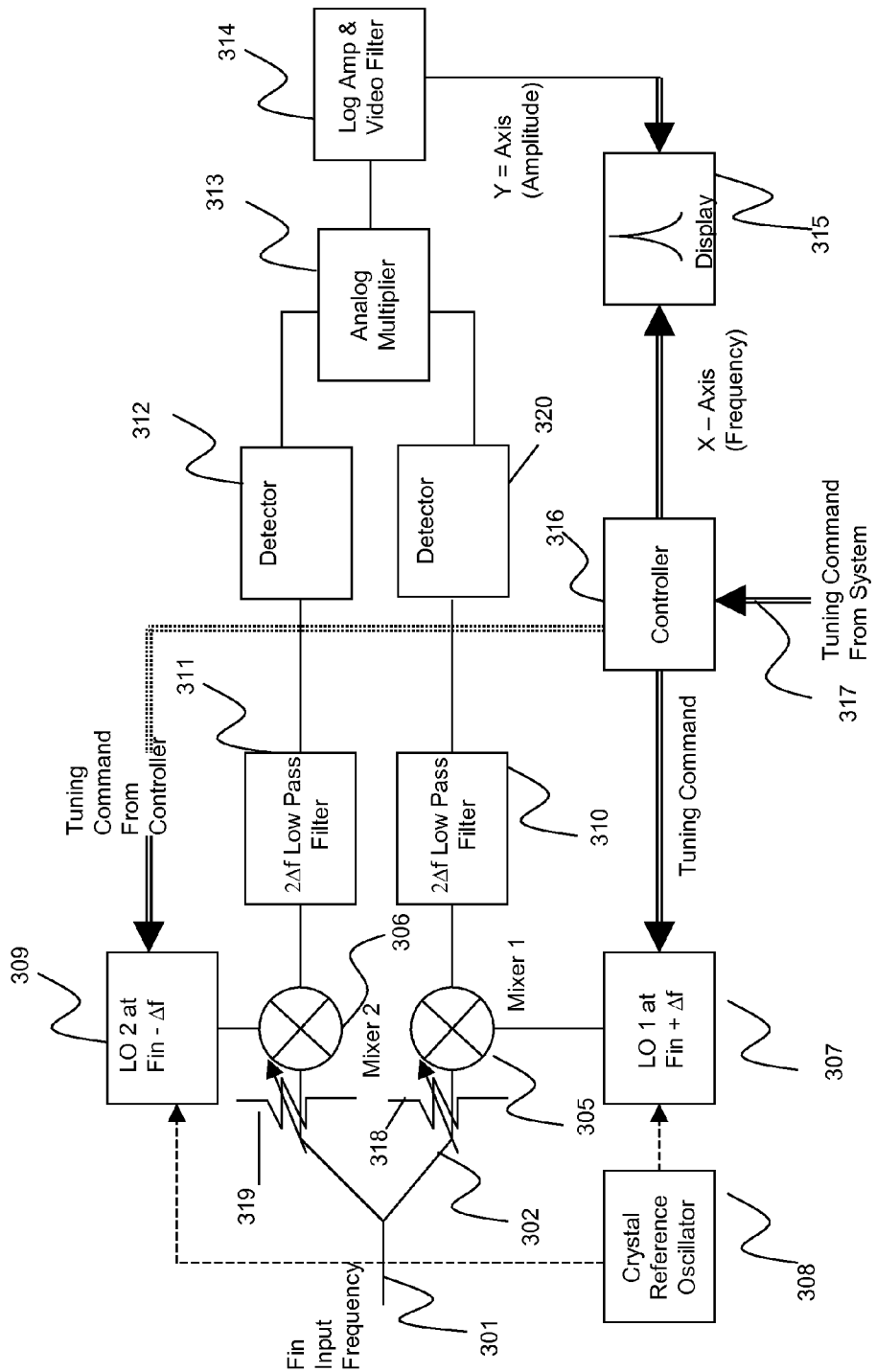
FIG. 3 shows a possible basic concept of the High Speed Spectrum Analyzer this invention represents.

The proposed instrument block diagram is shown in simplified form in FIG. 3. The input signal 301 at frequency Fin is split into two equal signals at the splitter 302. One half of the signal is input to Mixer1, 305 and the other half to Mixer 2, 306. The local oscillator 307 for Mixer 1 is at a frequency Flo+$\Delta$f, and the local oscillator 309 for Mixer 2 is at frequency Flo−$\Delta$f. The value of $\Delta$f is kept constant and Flo is varied linearly with time from start frequency to some stop frequency, which define the region of interest for incoming signals. Both the local oscillators at Flo+$\Delta$f and at Flo−$\Delta$f are frequency synthesized at every point in the sweep and are controlled by the same crystal reference 308, so that they are exactly 2$\Delta$f apart in frequency. The offset $\Delta$f can be a very small offset, for example 10 KHz, or very large, for example 10 MHz or even higher. Of course, $\Delta$f can be chosen to be any number depending upon the spectrum analyzer signal parameters desired, as will be discussed later. The Mixer 1 and Mixer 2 outputs are at frequencies given by $$F\text{mix1} = \pm m \cdot F\text{in} \pm n \cdot (F\text{lo}+\Delta f) \quad (1)$$

and $$F\text{mix2} = \pm m \cdot F\text{in} \pm n \cdot (F\text{lo}-\Delta f) \quad (2)$$

where m and n are integers. Ignoring all but fundamental mixing products for the time being for the purpose of demonstrating the principles of the invention, m and n are both set at 1. The outputs of mixers 1 and 2, Fmix1 and Fmix2 are filtered by low pass filters 310 and 311 that cut off, for this example, at 2$\Delta$f. There are three possibilities depending upon Fin, Flo and $\Delta$f:

$F\text{in} > F\text{lo}+\Delta f$, so that $F\text{mix1} > \Delta f$,      Case 1 or, $F\text{in} < F\text{lo}-\Delta f$, so that $F\text{mix2} > \Delta f$      Case 2 or, $F\text{lo}+\Delta f > F\text{in} > F\text{lo}-\Delta f$ so that $F\text{mix1} < \Delta f$ and $F\text{mix2} < \Delta f$      Case 3

In the first two cases each of the two mixer products Fmix1 and Fmix2 will be filtered out by its low pass filter leaving no input to Detector 312 or Detector 320, so that Analog Multiplier 313 will have no output other than frequency translated incoming noise power. In the third case both mixers will have an output within the 2$\Delta$f low pass filter range. In the special case where Fin=Flo+$\Delta$f, or Fin−Flo−$\Delta$f we have a DC output, which is usually called a zero beat. In general, the Analog multiplier 313 will have an output in proportion to the input signal amplitude within the 2$\Delta$f frequency range.

This is demonstrated in table form in FIG. 4, where the input signal is at 5000 MHz and the two local oscillators Flo+$\Delta$f and Flo−$\Delta$f are swept as shown in 10 MHz steps. The outputs of Low Pass Filters 310 and 311 can be seen to both have non zero values only between Flo of 4990 and 5010 MHz, which is centered around the signal frequency of interest, 5000 MHz. Thus the detectors 312 and 320 will have non-zero outputs and the Analog Multiplier 312 has an output only within this frequency range. The detectors employed are typically square law detectors, so that the output voltage of the detector is proportional to the input power. This output is amplified logarithmically in the logarithmic amplifier—video filter combination 314 to convert the signal so it can be shown on a decibel scale, and to average out the effects of the low frequency noise, and sent to the Y-axis of the display 315. Of course, the Logarithmic amplifier in this description is for discussion purposes only. It can also be replaced with a linear amplifier if a linear power display is desired. The X-axis of the display 315 is derived from the Tuning Command 317 via controller 316. Controller 316 also sends frequency synthesis commands to LO1 307 and LO2 309.

It should be pointed out that this example, while realistic, is mainly meant to illustrate the functionality of the system. As will be shown shortly, by the judicious choice of M, and use of multiple filters, detectors and multipliers, the system allows for the resolution bandwidth of the analyzer to be varied so that the system sensitivity is increased or decreased on the fly as desired to enable accurate measurements on incoming signals. It should also be pointed out that at any input frequency Fin that the spectrum analyzer is tuned to, there is a certain amount of noise power input due to ambient (also called kTB) noise and other noise sources inherent to active and passive devices, so that, in the absence of any signal at 5000 MHz in the example of FIG. 4, there will still exist frequency converted input noise. Also, if the mixer LPF bandwidth is only 20 KHz, for example, then there will only be a response between Flo frequencies of 4999.99 MHz and 5000.01 MHz. The selection of the value of $\Delta$f and the low pass filter bandwidth effectively control the resolution bandwidth of the instrument, in other words how accurately the incoming signal frequency can be resolved and its amplitude can be determined. In addition, outputs of the signal splitter 302 can be equalized by optionally installing programmable attenuators 318 and 319 at the splitter outputs. Knowing the LO frequency, with a EEPROM resident table in controller 316, for example, attenuators 318 and 319 can be controlled so that the inputs to mixer 1 and mixer 2 are equal in amplitude to each other at any input frequency being scanned. Alternatively, a closed loop method can be employed that samples the split signals and attenuates one path or the other in such a fashion that the signals are equal in amplitude at the input of each mixer.

Referring to the table in FIG. 4 again, consider what happens if the LO frequency separation $\Delta$f is kept at 10 MHz and the mixer output is put through a lowpass filter of bandwidth $\Delta$fl=20 KHz. In this case at the range of frequencies Fin such that the Absolute value of (Fin−Flo)<$\Delta$fl, there will be a detected signal proportional to the input signal. What this implies is that by keeping the LO frequency separation $\Delta$f large, for example 100 MHz, and passing the mixer output through different low pass filters of different bandwidths $\Delta$fl, multiple resolution measurements can be simultaneously made within a single sweep. This powerful advantage is described in greater detail later in this document. Of course, in order to take full advantage of this power, the sweep itself would need to be an Adaptive Sweep, that is a sweep that slows down and uses smaller LO frequency step sizes when $\Delta fl$ is reduced, and speeded up with commensurately larger LO step, sizes when $\Delta fl$ is increased. In effect, the Adaptive Spectrum Analyzer speeds through regions where there are no signals of interest, and slows down to a speed, commensurate with $\Delta fl$, when a signal of interest is to be viewed in greater detail or analyzed.

We now show how the method eliminates the need for preselection. Consider one leg of the input section as shown in equation (1) above. The question is, if m=n=1 satisfies the equation $$\mathrm{Abs}[Fin - Flo] \leq \Delta f,$$

where the symbol ≤ implies "less than or equal to", and where Abs[x] implies the absolute value of the quantity x within the square brackets, then can any other integer values of m>1 and n>1 exist such that $$\mathrm{Abs}[m \cdot Fin - n \cdot Flo] \leq \Delta f.$$

Substituting Flo=Fin+$\Delta f$, the above equation can be written as $$\mathrm{Abs}[(m-n)Fin - n\Delta f] \leq \Delta f$$

Which can be simplified by dividing both sides by $n \cdot \Delta f$ to give $$\mathrm{Abs}[(m/n - 1)(Fin/\Delta f) - 1] \leq 1/n$$

At microwave frequencies where Fin is of the order of 1 or more GHz and with $\Delta f$ of the order of 10 MHz or less, Fin/$\Delta f$ >>1. Three cases arise from this inequality, which are m=n, or m>n, or m<n. If m=n, then the above equation reduces to $$1/n > 1, \text{ which is possible only if } n=1.$$

If m>n, then since Fin/$\Delta f$>>1, the relation can be shown to reduce to $$(Fin/\Delta f) \cdot (m/n) \leq (Fin/\Delta f) + 1 + 1/n$$

If, for example Fin=1 GHz and $\Delta f$=10 MHz, Fin/$\Delta f$=100, and the equation reduces to $$100m/n \leq 101 + 1/n, \text{ or } m < 101n/100 + 1/n$$

In the limit, as n tends to very high integer values this says m<n. at the lowest possible value of n, which is n=1, m<1.01+1, i.e. m=1 which we already discussed. Given the starting assumption for this case that m>n this leads to a contradiction since m cannot be greater and smaller than n at the same time. That is, if Fin>>$\Delta f$ no solution such that m>n exists.

Taking now the third case, where m<n, the equation can be shown to reduce to $$\mathrm{Abs}[1 - (1 - m/n)(Fin/\Delta f)] \geq 1/n.$$

For the smallest possible value of m, m=1, this reduces to $$1 - 1/n \geq (1 - 1/n)(Fin/\Delta f)$$

which is a mathematical impossibility if Fin>$\Delta f$.

We have thus proved that under any practical circumstance, no image frequency can exist. In actuality, since equation (2) above would also need be simultaneously satisfied to have an output at detector 313, this clearly shows that there is no preselection needed.

The power of this technique is that, in an environment where there are a number of discrete frequency ranges with possible signals, such as in a multiple radar environment, it is possible to sweep very wide frequency ranges with a large $\Delta f$ at very high sweep rates, and when a signal of interest is spotted, to immediately decrease $\Delta f$ in order to more accurately measure the frequency and identify its sidebands and modulation characteristics. Since there is no need for preselection, the spectrum analyzer we propose here can scan the incoming signal environment at very wide apertures and quickly identify and home-in on any desired signal without having to resort to multiple sweeps.

To summarize, if a signal at frequency Fsig=Fin is input to the our spectrum analyzer such that the absolute value of (Fsig–Flo)≤$\Delta f$ the output of filter 310, 311 and multiplier 312 will be exactly proportional to the input signal level. At frequencies where the absolute value of (Fsig–Flo)>$\Delta f$, there is no output other than that proportional to the input noise at frequency Fsig.

We have demonstrated that our technique eliminates the need for preselection, and therefore for a Preselector Filter and a Local Oscillator to track each other in frequency over wide frequency ranges as the traditional Spectrum Analyzers do. This eliminates the need for slower magnetically tuned YIG devices, which are replaced with 100 or more times faster varactor tuned and frequency synthesized all solid state Local Oscillators or Direct Digital Synthesized (DDS) oscillators. Further, the Local Oscillators of this proposed system are synthesized and accurate at every measurement point, unlike the YIG devices, which are not phase locked and therefore truly accurate only at the starting frequency of each sweep.

Figure 5:
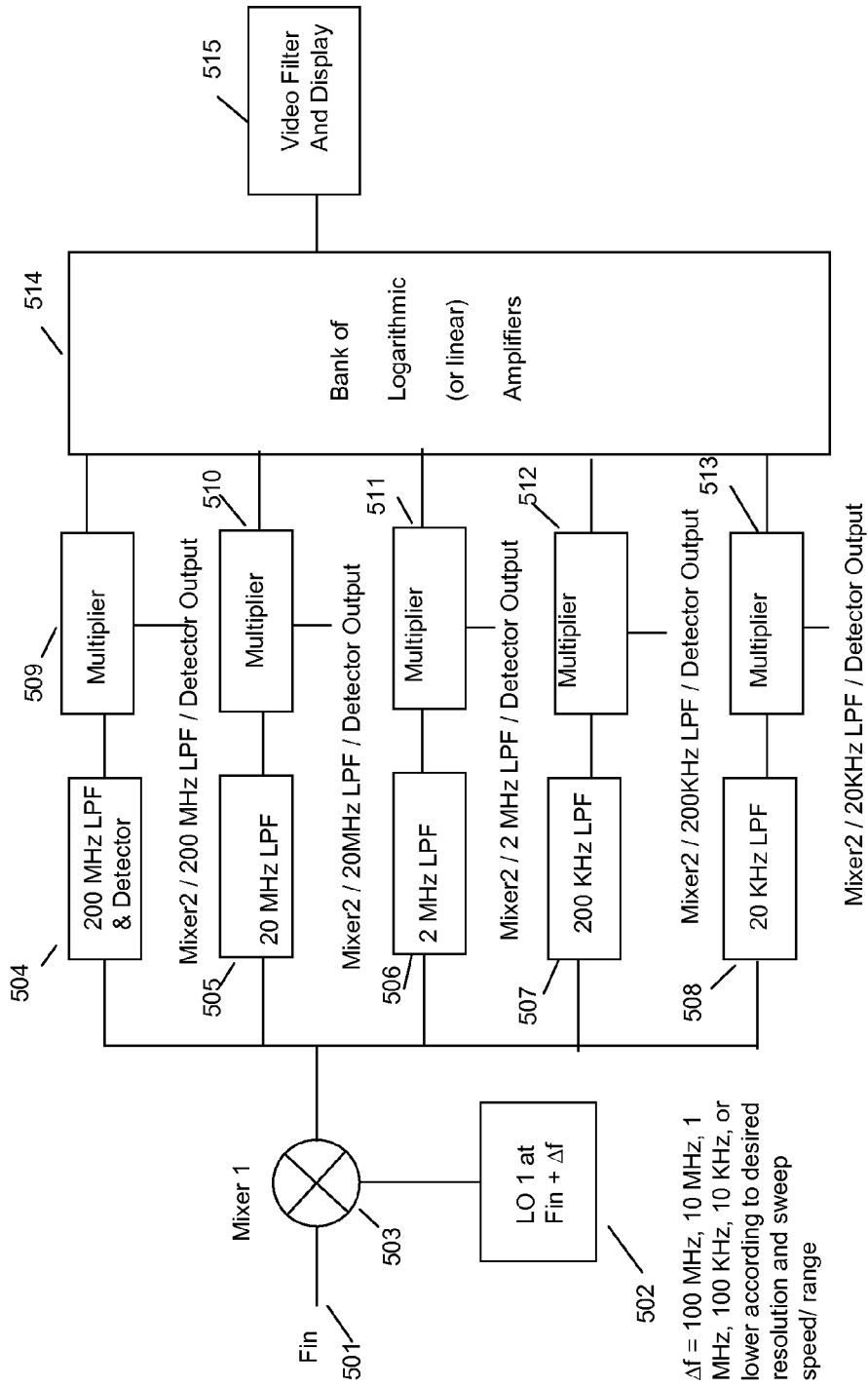
FIG. 5 shows the concept of an Adaptive Spectrum Analysis using one half of the analyzer architecture.
Figure 6:
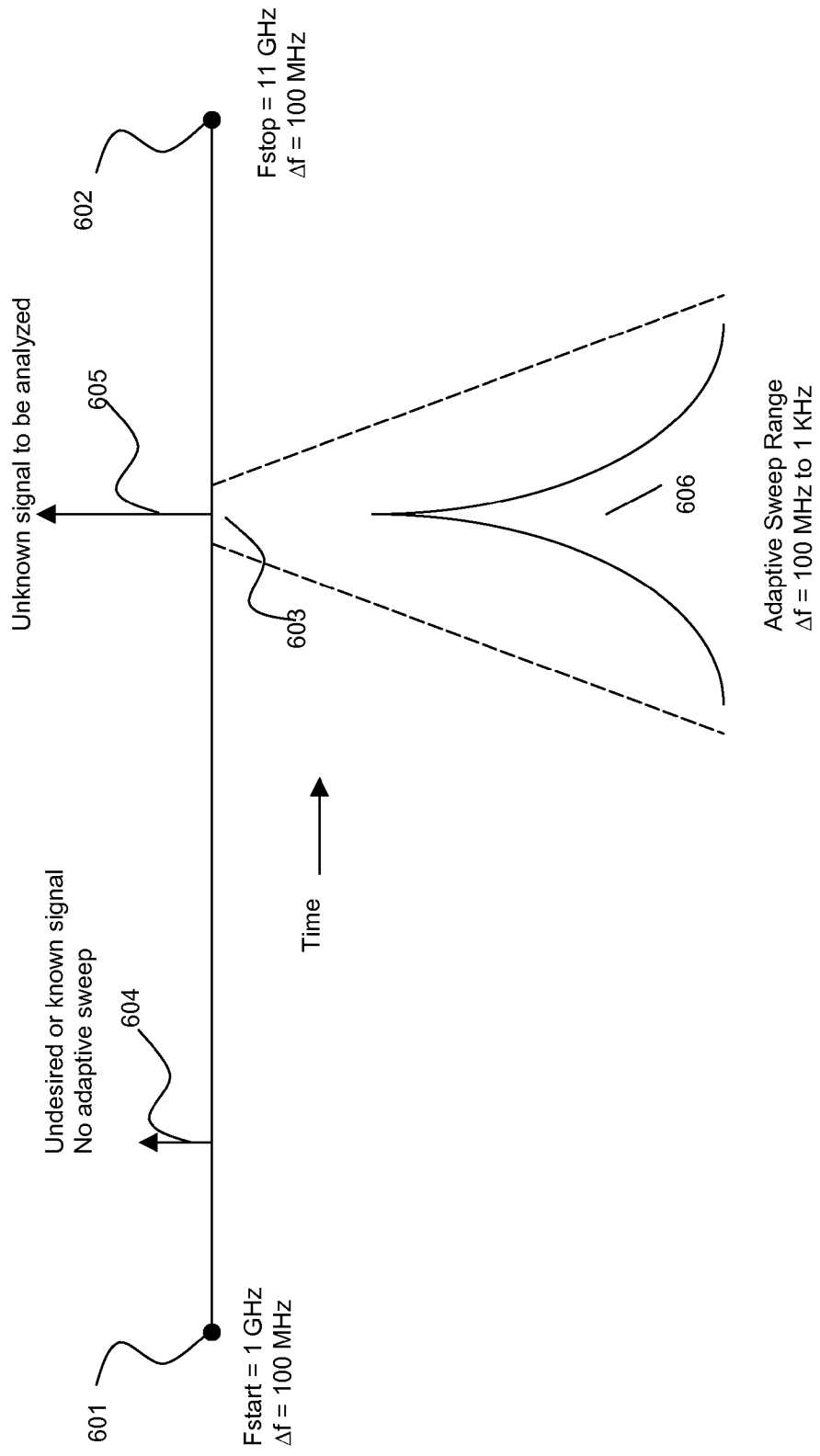
FIG. 6 shows the ability to perform multiple Resolution bandwidth measurements simultaneously.

A resultant powerful feature made possible by the invention is demonstrated in FIGS. 5 and 6. FIG. 5 shows another possible realization in greater detail. In this figure, in order to make the explanation simpler, we show only one half of the input signal path where Fin, 501 is the signal into one of the two mixers after the input splitter. Fin is mixed with Flo1 which in this half of the block diagram is Fin+$\Delta f$. At the initial start of a measurement for an unknown signal, if the frequency range of the desired signal is unknown, we would need a wide sweep, and a wide $\Delta f$, which in this case may for example, be 100 MHz. A 100 MHz $\Delta f$ and 100 MHz step size, assuming a 100 step sweep between the start and stop frequency, would allow measuring signals over a 10 GHz frequency range (100 MHz step size X 100 steps) in a single sweep. The output of the mixer 503 is divided into 5 sections and passed through 200 MHz, 20 MHz, 2 MHz, 200 KHz, and 20 KHz Low Pass filters each followed by a detector 504, 505, 506, 507, and 508, and shown as each representing a possible 2$\Delta f$ bandwidth, all of which outputs are processed in parallel through different multipliers 509, 510, 511, 512, 513, where the signals are multiplied by the IF filter-detector combination of the other half of the circuit, video filters and logarithms (or linear) amplifiers, and the selected multiplier-amplifier output is sent to the Y-axis of the display.

If a signal that occurs within any particular 100 MHz bandwidth segment is recognized by the 200 MHz filter-detector 504, then the 20 MHz bandwidth filter-detector 505 and multiplier 510 output starts to be simultaneously measured in the log amp 514 and the sweep step size is correspondingly reduced to 10 MHz. When the 20 MHz $\Delta f$ filter starts showing an output, the two LO offsets are reduced to 10 MHz, and the sweep continued. At this point the 2 MHz filter-detector 506 output starts to be measured via multiplier 511 and amplifier 514. And when there is a significant output as set by some amplitude measurement threshold, the step size and $\Delta f$ is changed to 1 MHz, and the sweep speed is correspondingly reduced. This same sequence of reducing step size and reducing $\Delta f$ can be carried out until the desired resolution is reached. This is very similar to the situation in a video camera where the aperture is continuously reduced or the zoom continuously increased when an object of interest is noticed. Once the center frequency is passed, the bandwidth and LO step size can be increased again step by step as Δf frequency thresholds are passed, and the sweep speed correspondingly increased.

This capability of the system, which we call the Adaptive Sweep capability, allows the user of the spectrum analyzer to catch the existence of a signal within microseconds and to set measurement and Resolution bandwidth thresholds based upon the range of frequencies for the signals of interest. This is demonstrated in a time domain picture in FIG. 6. For example, if the signals of interest are in the 6 to 10 GHz range, then a signal encountered at 2 GHz can be ignored by the simple choice of keeping the Δf and LO step size high, for example at 100 MHz so that no time is spent on adaptive sweeping that particular signal frequency range. When a signal at 7 GHz is encountered as in this example, the system quickly becomes adaptive and pinpoints the frequency of the signal and its sidebands and modulation characteristics. Thus, until the instrument gets close to a signal of interest, 605, the Δf is kept at 100 MHz, and the LO tunes at speeds and steps in excess of 100 MHz per microsecond. If the unknown signal is at around 6 or 7 GHz, as in this example, the spectrum analyzer can get to the desired frequency in less than 100 microseconds, on the way ignoring the known but undesired signal 604. When a signal 605 is encountered, a described using FIG. 5, the Δf, effectively the resolution bandwidth is continuously decreased and the tuning speed is also continuously decreased so the signal can be measured accurately. Once the signal is passed, the speed again increases as Δf is increased and dwell times at each frequency decreased.

Adaptive sweep works well in this system because multiple IF frequency bandwidths, Δf are simultaneously processed and the meaningful aperture or resolution bandwidth can be selected based upon operator input or a preset algorithm. It does not require multiple sweeps as the preselected YIG swept spectrum analyzer would. A typical YIG based spectrum analyzer covering a 10 GHz frequency range requires 400 milliseconds per sweep, and would need 3 to 5 sweeps to center the signal at the desired frequency and zoom in. That is, an accurate signal verification process would take at least 5, usually more than 10 seconds, possibly many times more. The adaptive sweep approach allows this signal capture and analysis to occur in a single sweep. Assuming that the zoom occurs down to 10 KHz bandwidth for a 10 MHz region, the entire process could take less than 20 milliseconds, at least 100 times faster than a traditional spectrum analyzer.

Figure 7:
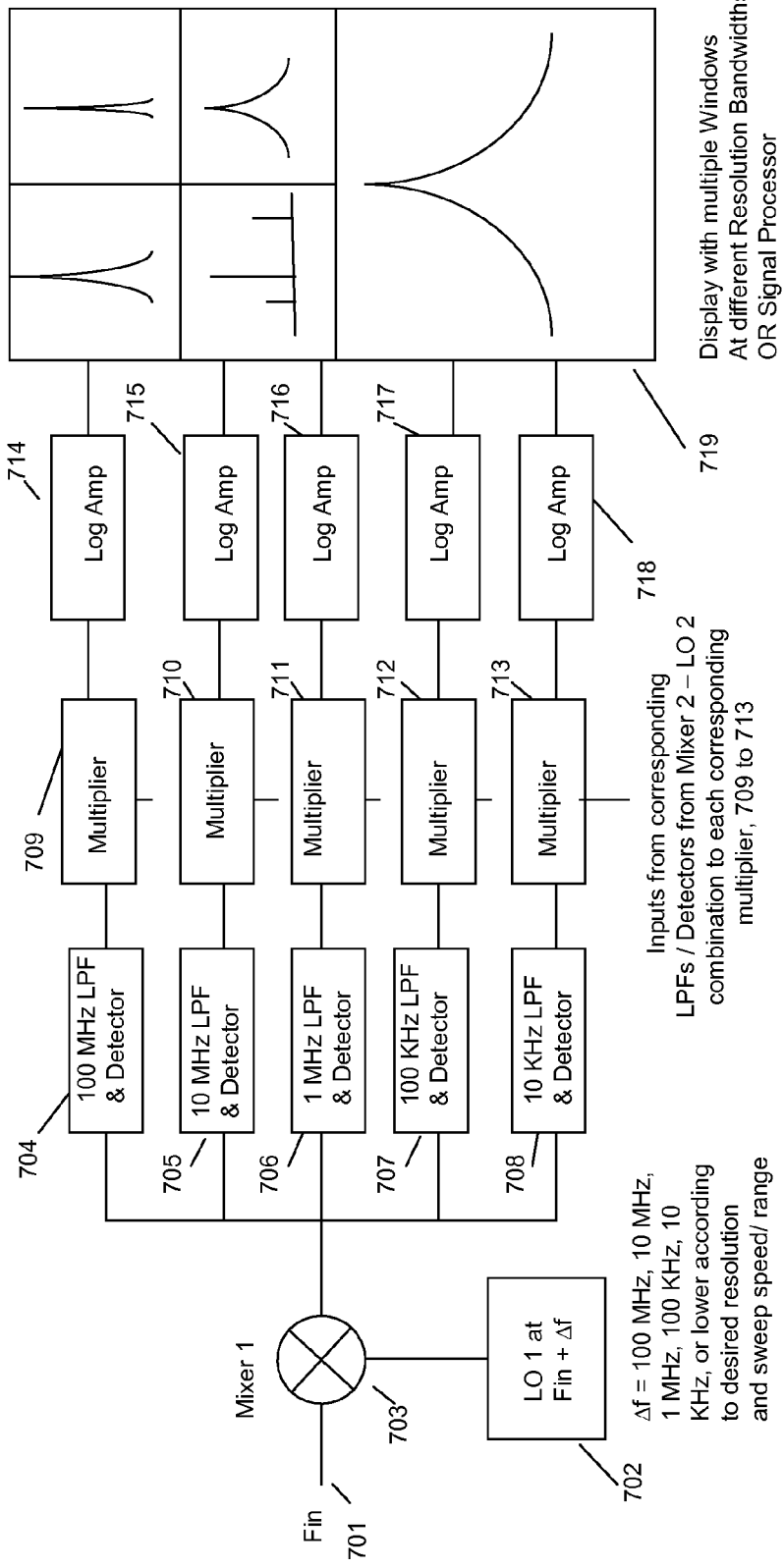
FIG. 7 shows the how the system can be used for Simultaneous Signal Analysis.

Another capability that the present analyzer architecture results in is the ability for Simultaneous Processing. Simultaneous processing as shown in FIG. 7 affords the user another significant capability, that of being able to analyze a signal at multiple resolution bandwidths simultaneously. The system can have an LO offset that is high, say 100 MHz, but the various Δf filters-detectors 704 through 708 will have an output only when, for any Δf, Fin and Flo are such that the absolute value of (Fin−Flo) is less than Δf. At this point, the appropriate multiplier 709 to 713 will have a non zero output and if this signal is of interest, the sweep can be slowed down by lowering the step size and also if necessary by stepping at the lower value of Δf. The Log Video Amplifiers 714 through 718 simultaneously process any signal and display on multiple windows of the display 719. Simultaneous Processing is thus a powerful adjunct to Adaptive processing in it that decisions do not necessarily need to be made by reducing Δf in a step wise fashion, but can be made based upon the bandwidth of interest and adjusting sweep step size and speed adaptively. This powerful capability that is made possible by this invention cannot be achieved by traditional methods.

Simultaneous processing is made possible with our architecture because three important parameters can be simultaneously and independently varied. These are the step size of the LO, the resolution bandwidth Δf, the switching speed, and the multiplier and detector chosen. This effectively allows the unit to adaptively sweep and simultaneously process at multiple resolutions and speeds.

To vary the sweep speed as the resolution is reduced, the dwell time at each frequency is controlled. As the resolution bandwidth is reduced, the time that the LOs spend at each frequency is typically increased to allow more accurate measurement of the detected output. With faster digital signal processing capabilities this dwell time can be significantly reduced.

In Radar and Electronic Warfare systems this Adaptive and Simultaneous Processing capability has extensive applicability. In this case the display 719 may not be a display but a signal processor that analyzes the spectrum and possibly generates a countermeasure waveforms.

It should be pointed out that the Δf values as well as the filter bandwidths that are used in the above descriptions are for the purpose of illustration only. They have been chosen so that a clear contrast can be drawn between the traditional preselected approach and the Adaptive and Simultaneous processing approach. In point of fact, for the present system, any set of values that are practical can be used.

To summarize, by using a dual Local Oscillator front end and doing appropriate signal processing post the mixers, we have eliminated the need for preselection. Further, the method allows Adaptive signal processing so one or more signals can be analyzed in a single sweep, or Simultaneous signal processing where multiple spectra of a signal of interest at multiple bandwidth can be simultaneously analyzed or inspected for quick analysis decision making in systems applications with frequency agile inputs.

Another powerful and obvious extension of the patent is that if the incoming signal is divided into multiple paths each covering a narrower range—for example, by building 10 separate receivers that process 2 GHz each to cover a total 20 GHz bandwidth, the signal capture and analysis speed could be reduced to microseconds or even nanoseconds, providing more such a system much more capability than traditional Direct Instantaneous Frequency Measurement receivers used in Electronic Warfare.

Figure 8:
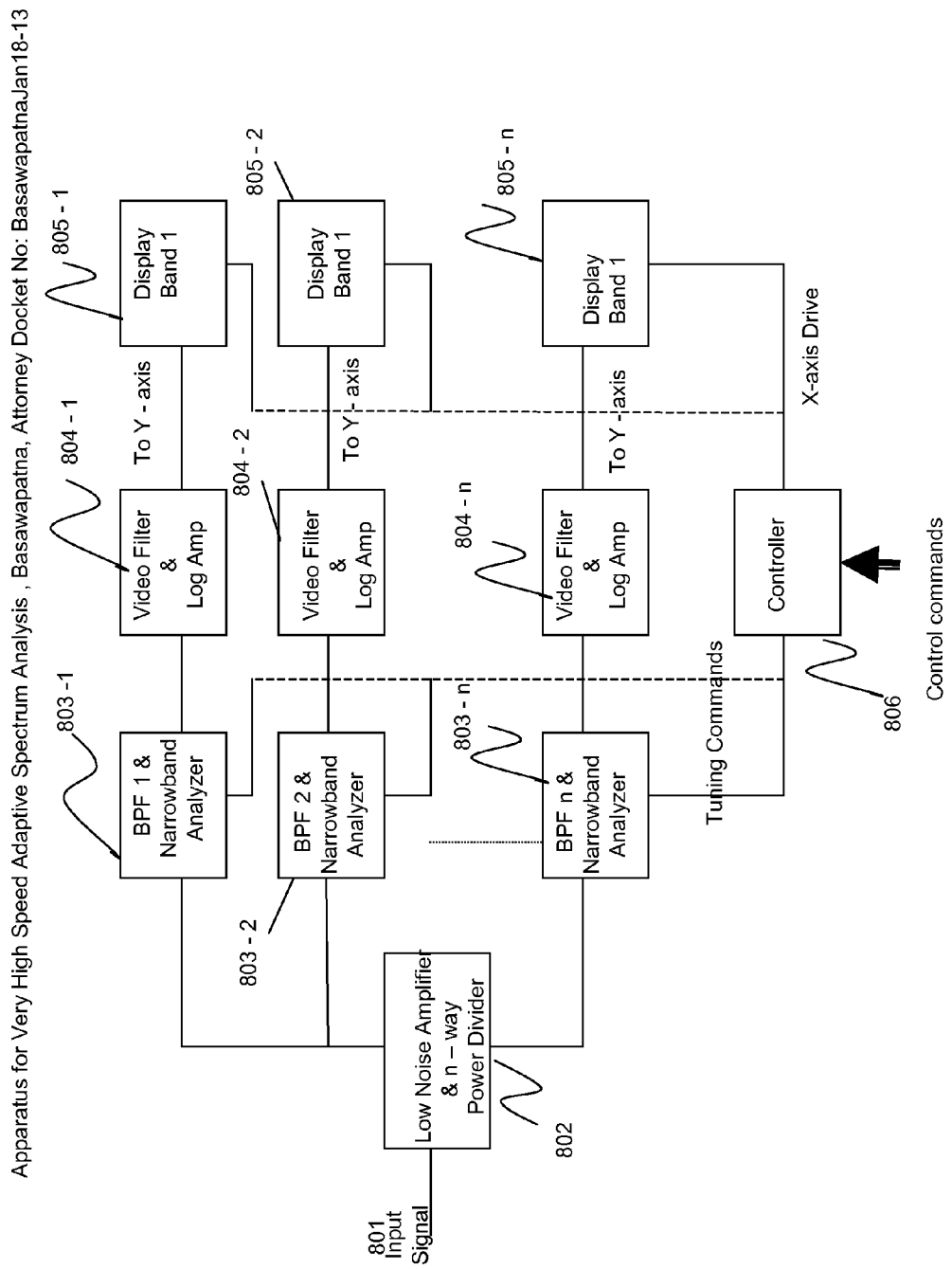
FIG. 8 shows the realization of a device similar to the Instantaneous Frequency Measurement Devices that is another result of the present invention.

Referring to FIG. 8, if, for example, 803-1 to 803-*n* are n Adaptive Analyzers each scanning only 2 GHz, for example, and 804-1 through 804-*n* are the corresponding n video filters and logarithmic amplifiers, and 805-1 through 805-*n* are the corresponding n displays, and 802 is a Low Noise wideband amplifier and n-way power splitter at the input, and 806 is a controller that takes control commands and simultaneously high speed sweeps with, for example 50 MHz steps and 100 MHz IF in each analyzer arm, then an input signal 801 can be analyzed within 50 MHz accuracy and identified accurately within microseconds. This is much faster than the regular spectrum analyzers and much more accurate than traditional Digital Instantaneous Frequency Measurement devices used in Electronic Warfare.

We claim:

1. A Broadband Receiver usable as an Adaptive Sweep Spectrum or Signal Analyzer (BASA) capable of accurate scanning and measurement of unknown signals at very high speeds and with very high levels of accuracy, consisting of:
   a Signal Splitter at the input to the BASA to split an incoming signal into two parts;
   two Local Oscillators whose output frequencies are symmetrically apart at a selectable frequency separation from the frequency of the incoming signal being scanned for, the Local Oscillators being tuned together through a frequency range of interest for the measurement;

two Mixers, each of whose input Radio Frequency (RF) signals is one of the two outputs of the Signal Splitter, and each of whose Local Oscillator is one of the two Local Oscillators that are tuned together;

two Low Pass Filters whose bandwidth can be made arbitrarily small to increase accuracy or arbitrarily large to increase speed of scanning and signal identification, respectively filtering the outputs of the two mixers to output any mixer product signals or noise within the low pass filter bandwidth;

two Detectors one each at each low pass filter output that detects and outputs a DC voltage proportional to the input power into each Detector;

an Analog Multiplier that multiplies the two low pass filtered and detected mixer outputs;

a Video Filter and Logarithmic or Linear Amplifier combination whose input attaches to the Analog Multiplier's output and whose output is connected to a display or to a signal processor or analyzer;

wherein when the BASA is used as a Spectrum Analyzer, the X-axis of the Spectrum Analyzer display is a voltage proportional to the incoming frequency being scanned for as a fraction of the total frequency range being scanned for signals, and the Y-axis of the display is the detected and amplified output of the Analog Multiplier;

wherein if there exists a signal, or if there exists noise at the frequency being scanned at the input to the BASA, the detected and amplified output of the Analog Multiplier is proportional to the power of the incoming signal or noise power within the Low Pass Filter bandwidth;

wherein the need for preselection filters at the input so as not to have spurious images is eliminated by a dual Mixer, Local Oscillator, and Low Pass Filter combination, allowing much higher speeds of spectrum scanning and digital phase locked loop accuracy at every frequency wherein the amplitude accuracy can be controlled via programmable attenuators or some closed loop method that corrects any input splitter imbalance if needed as a function of incoming frequency being scanned for.

2. The Broadband Receiver and Adaptive Spectrum Analyzer BASA of claim 1, where the Local Oscillators are Frequency Synthesized with a common reference crystal oscillator or signal source.

3. The Broadband Receiver and Adaptive Spectrum Analyzer BASA of claim 1, where the mixers are harmonic mixers that mix the harmonics of the local oscillator with the frequency being scanned so as to provide a proportional baseband output in the presence of a signal.

4. The Broadband Receiver and Adaptive Spectrum Analyzer BASA of claim 1, where the low pass filter cutoff frequency can be selected or modified based upon the resolution bandwidth and spectral detail desired.

5. The Broadband Receiver and Adaptive Spectrum Analyzer, BASA of claim 1, where the speed of tuning of the local oscillator frequencies can be modified based upon the resolution bandwidth desired in any range of scanned frequencies.

6. The Broadband Receiver and Adaptive Spectrum Analyzer, BASA of claim 1, where the video bandwidth of the video filter is selectable based upon the degree of signal smoothing that is desired.

7. The Broadband Receiver and Adaptive Spectrum Analyzer, BASA of claim 1, where the controller that controls the scan frequency, scan rate, dwell time at each frequency and other parameters of the system, and the display characteristics is a commercially available or special purpose microcontroller.

8. The Broadband Receiver and Adaptive Spectrum Analyzer, BASA of claim 1, where the controller that controls the scan frequency, scan rate, dwell time at each frequency and other parameters of the system, and the display characteristics is a PC or other computer based instrument or processor that uses a standard or special purpose instrument bus control.

9. A Broadband Receiver usable as an Adaptive Sweep Spectrum or Signal Analyzer (BASA), capable of accurate scanning and measurement of unknown signals at very high speeds and with very high levels of accuracy, consisting of:

a Signal Splitter at the input to the BASA to split an incoming signal into the BASA into two parts;

two Local Oscillators whose output frequencies are symmetrically apart at a selectable frequency separation from an incoming frequency being scanned for, the Local Oscillators being tuned together through the frequency range of interest for the measurement;

two Mixers, each of whose input Radio Frequency (RF) signals is one of the two outputs of the Signal Splitter, and each of whose Local Oscillators is one of the two Local Oscillators that are tuned together, the Intermediate Frequency (IF) output signal path of each mixer hereafter being referred to as an Arm;

an n-way splitter at the IF output of each mixer, where n is an integer, and can be chosen to be the number of low pass filters needed to set the resolution bandwidths desired for the spectrum analyzer;

selected bandwidth Low Pass Filters at the end of each of the n-way splitter Arms depending upon the various resolution bandwidths desired so that each filter output is a low-pass signal within the selected resolution bandwidth for that Arm;

Detectors one each at each low pass filter output that detect and output a DC voltage proportional to the input power;

an Analog Multiplier at the output of each detector that multiplies the two low pass filtered and detected mixer outputs of one Arm with the corresponding detected output of the other Arm;

an amplifier Video Filter and Logarithmic or Linear Amplifier combination whose input attaches to each analog multiplier output and whose output is connected to a Display Processor or Signal Processor or Signal Analyzer;

wherein when the BASA is used as a Spectrum Analyzer, the X-axis of the Spectrum Analyzer display is a voltage proportional to the incoming frequency being scanned for as a fraction of the total frequency range being scanned for signals, and the Y-axis of the display is the detected and amplified output of the Analog Multiplier;

wherein if there exists a signal, or if there exists noise at the frequency being scanned at the input to the BASA, the detected and amplified output of the Analog Multiplier is proportional to the power of the incoming signal or noise power within the Low Pass Filter bandwidth;

wherein the need for preselection filters at the input so as not to have spurious images is eliminated by the dual Mixer, Local Oscillator, and Low Pass Filter combination, allowing much higher speeds of spectrum scanning and digital phase locked loop accuracy at every frequency;

wherein the amplitude accuracy can be controlled via programmable attenuators or other closed loop means that correct any input splitter imbalance if needed as a function of input frequency;

wherein the Local Oscillator tuning speed and step size are adjusted within any sweep such that the scan speed is high at the parts of the sweep where there is no IF output below some threshold level, or where the signal presence is of no interest to the measurement being made, and is decreased at frequencies where the resolution bandwidth is reduced, so that the sweep speed is adaptive, being low at frequencies where there is a signal of interest and fast where there is none.

10. The Broadband Receiver and Adaptive Spectrum Analyzer BASA of claim 9 where the speed of tuning of the local oscillator frequencies can be modified based upon the resolution bandwidth desired in any range of scanned frequencies.

11. The Broadband Receiver and Adaptive Spectrum Analyzer BASA of claim 9, where the video bandwidth of each individual path video filter is selectable based upon the degree of signal smoothing that is desired.

12. The Broadband Receiver and Adaptive Spectrum Analyzer BASA of claim 9, where the controller that controls the step size, scan frequency, local oscillator dwell time at each step and other parameters related to the measurement and the display characteristics, is a commercially available or special purpose microcontroller.

13. The Broadband Receiver and Adaptive Spectrum Analyzer BASA of claim 9, where the controller that controls the step size, scan frequency, local oscillator dwell time at each step and other parameters related to the measurement and the display characteristics, is a PC or other computer based instrument or processor that uses a standard or special purpose instrument bus control.

14. The Broadband Receiver and Adaptive Spectrum Analyzer of claim 9, where the Local Oscillators are Frequency Synthesized with a common reference crystal oscillator or signal source.

15. The Broadband Receiver and Adaptive Spectrum Analyzer BASA of claim 9, where the mixers are harmonic mixers that mix harmonics of the local oscillator with the frequency being scanned.

16. The Broadband Receiver and Adaptive Spectrum Analyzer BASA of claim 9 wherein the LO separation is kept at the widest possible level, and all the Intermediate Frequency paths are kept active with parallel displays, and where the sweep step size and sweep speed are adjusted to low values when a signal needs to be recorded or analyzed with a narrow resolution bandwidth, and adjusted for fast response elsewhere, in such a way that multiple signals of interest can be simultaneously viewed and analyzed all within the period of a single sweep thus resulting in an Adaptive Simultaneous Spectrum Analyzer.

17. The Broadband Receiver and Adaptive Spectrum Analyzer BASA of claim 16, where the controller that controls the step size, scan frequency, LO Dwell Time and other parameters related to the measurement and the display characteristics, is a commercially available or special purpose microcontroller.

18. The Broadband Receiver and Adaptive Spectrum Analyzer BASA of claim 16, where the controller that controls the scan frequency, rate and other parameters of the system, and the display characteristics is a PC or other computer based instrument or processor that uses a standard or special purpose instrument bus control.

19. The Broadband Receiver and Adaptive Spectrum Analyzer BASA of claim 16, where the Local Oscillators are Frequency Synthesized with a common reference crystal oscillator or signal source.

20. The Broadband Receiver and Adaptive Spectrum Analyzer BASA of claim 16, where the mixers are harmonic mixers that mix harmonics of the local oscillator with the frequency being scanned.

21. The Broadband Receiver and Adaptive Spectrum Analyzer BASA of claim 16 where the speed of tuning of the local oscillator frequencies is changed based upon the resolution bandwidth desired in any range of scanned frequencies.

22. The Broadband Receiver and Adaptive Spectrum Analyzer BASA of claim 16, where the video bandwidth of each individual path video filter is selectable based upon the degree of signal smoothing that is desired.

23. The Broadband Receiver and Adaptive Spectrum Analyzer BASA capable of Simultaneous processing of claims 9, 16, 17, 18, 19, 20, 21, or 22 consisting of a selectable number of receivers, n, covering different bandwidths such that the incoming signal is split n ways and processed simultaneously so that signals covering wide frequency ranges can be broken into a number of smaller frequency ranges, and can be scanned and analyzed at n times the speed of a single broadband LO sweep so as to provide almost Instantaneous Frequency Measurement and signal analysis capabilities.

* * * * *